(12) United States Patent
Igeta et al.

(10) Patent No.: US 7,497,964 B2
(45) Date of Patent: Mar. 3, 2009

(54) PLASMA IGNITING METHOD AND SUBSTRATE PROCESSING METHOD

(75) Inventors: Masanobu Igeta, Albany, NY (US);
Kazuyoshi Yamazaki, Nirasaki (JP);
Shintaro Aoyama, Nirasaki (JP);
Hiroshi Shinriki, Matsudo (JP)

(73) Assignee: Tokyo Electron Limited, Tokyo (JP)

(*) Notice: Subject to any disclaimer, the term of this patent is extended or adjusted under 35 U.S.C. 154(b) by 77 days.

(21) Appl. No.: 11/432,332

(22) Filed: May 12, 2006

(65) Prior Publication Data

US 2006/0205188 A1    Sep. 14, 2006

Related U.S. Application Data

(63) Continuation of application No. PCT/JP2004/016588, filed on Nov. 9, 2004.

(30) Foreign Application Priority Data

Nov. 14, 2003    (JP) ............... 2003-384713

(51) Int. Cl.
*B44C 1/22* (2006.01)
*C03C 15/00* (2006.01)

(52) U.S. Cl. .............. 216/66; 216/67; 216/69; 438/730

(58) Field of Classification Search .......... 216/66, 216/67, 69; 438/730
See application file for complete search history.

(56) References Cited

U.S. PATENT DOCUMENTS

| 5,174,881 A | 12/1992 | Iwasaki et al. |
| 5,407,867 A | 4/1995 | Iwasaki et al. |
| 6,187,133 B1 * | 2/2001 | Knoot ............... 156/345.34 |
| 6,468,903 B2 * | 10/2002 | Bolscher et al. ........... 438/680 |
| 2001/0003015 A1 * | 6/2001 | Chang et al. ............ 427/569 |
| 2002/0055270 A1 * | 5/2002 | Narwankar et al. ........ 438/776 |
| 2002/0073925 A1 * | 6/2002 | Noble et al. .......... 118/723 ME |
| 2003/0102208 A1 * | 6/2003 | Fu ..................... 204/192.12 |
| 2003/0170945 A1 | 9/2003 | Igeta et al. |
| 2004/0147046 A1 * | 7/2004 | Miura ...................... 438/3 |

FOREIGN PATENT DOCUMENTS

| JP | 02-049428 | 2/1990 |
| WO | WO 03/049173 A1 | 6/2003 |

* cited by examiner

*Primary Examiner*—Binh X Tran
(74) *Attorney, Agent, or Firm*—Oblon, Spivak, McClelland, Maier & Neustadt, P.C.

(57) ABSTRACT

A method to solve such a problem that plasma will not ignite in restarting operation of a processing container that has not been operated with the inside kept drawn to vacuum. Gas containing oxygen is passed in a processing container 21, and ultraviolet light is irradiated to the gas while gas inside the processing container 21 is being discharged. After that, a remote plasma source 26 is driven to ignite plasma.

6 Claims, 12 Drawing Sheets

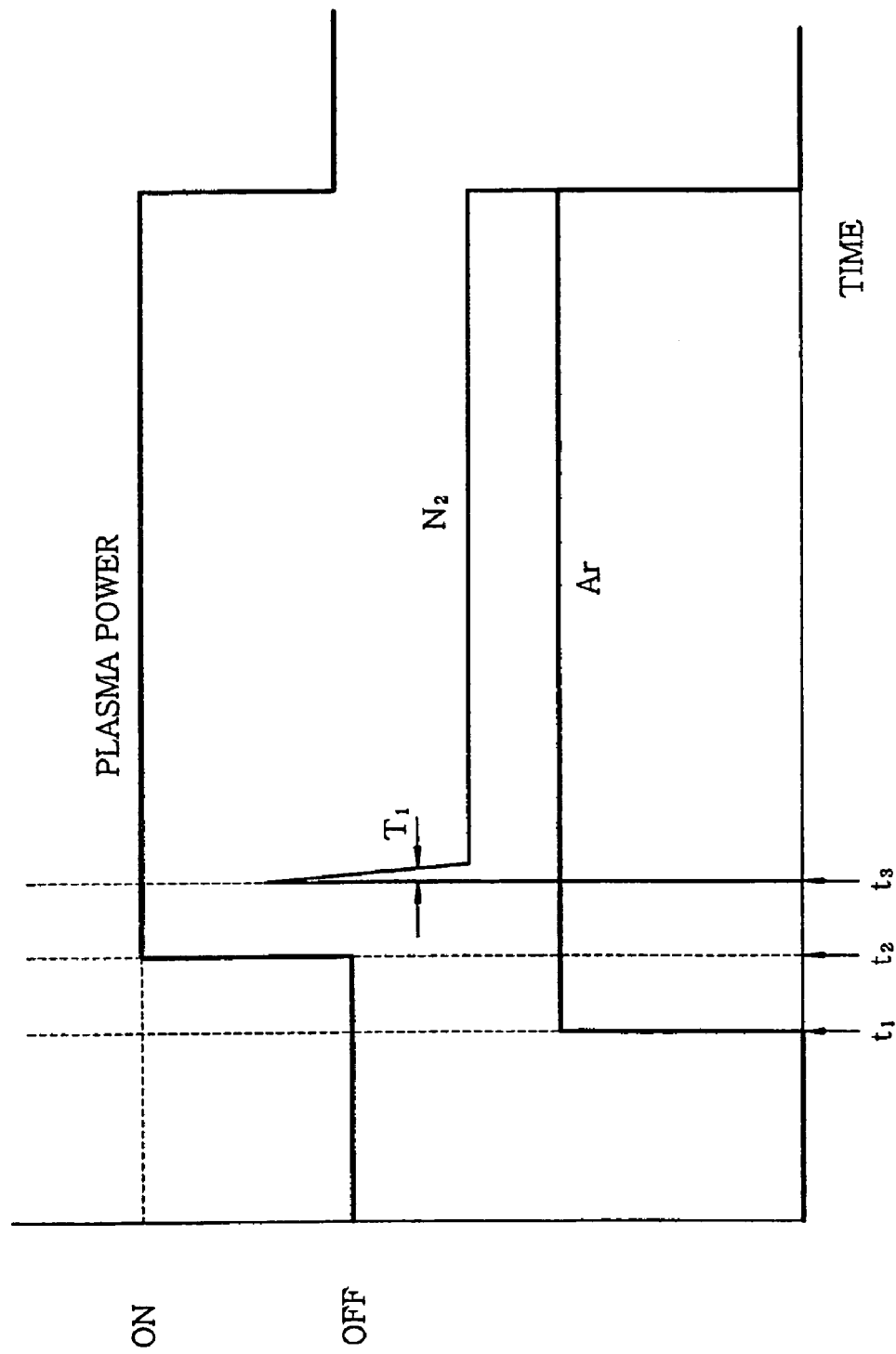

PLASMA IGNITING METHOD AND SUBSTRATE PROCESSING METHOD

This application is a Continuation Application of PCT International Application No. PCT/JP2004/016588 filed on Nov. 9, 2004, which designated the United States.

FIELD OF THE INVENTION

The present invention relates to a manufacture of a semiconductor apparatus; more particularly, to a substrate processing apparatus using oxygen radicals and nitrogen radicals.

BACKGROUND OF THE INVENTION

Due to the recent progress in miniaturization processes, the technology in the regime of a gate length of 0.1 μm or less is on the verge of being available for a real application in an ultrahigh speed semiconductor device. In general, while an operating speed of a semiconductor device is improved by miniaturization, accompanied with the reduction of the gate length achieved as a result of the device miniaturization in such an extremely miniaturized semiconductor device, it is imperative to reduce the thickness of a gate insulating film as well in accordance with a scaling rule.

In case the gate length is reduced to 0.1 μm or less, however, it is necessary to set the thickness of the gate insulating film to 1~2 nm or less when a conventional thermal oxide film is used for the gate insulating film. In such an extremely thin gate insulating film, a tunneling current is increased, which in turn inevitably increases a gate leakage current.

Under these circumstances, there has been a proposal of using a high-K dielectric material (what is called high-K material) having a much larger dielectric constant than that of a thermal oxide film and as a result, having a small $SiO_2$ equivalent thickness despite a large physical film thickness, such as $Ta_2O_5$, $Al_2O_3$, $ZrO_2$, $HfO_2$, $ZrSiO_4$ or $HfSiO_4$, for the gate insulating film. By using such a high-K dielectric material, it becomes possible to use a gate insulating film of about 10 nm in physical film thickness in ultrahigh speed semiconductor devices having an extremely short gate length of 0.1 μm or less. As a result, the gate leakage current caused by tunneling effect can be suppressed.

From the viewpoint of improving carrier mobility in channel region, it is preferable to interpose an extremely thin base oxide film having a thickness of 1 nm or less, preferably 0.8 nm or less, between the high-K dielectric gate oxide film and the silicon substrate. The base oxide film has to be extremely thin. If it is thick, the effect of using the high-K dielectric film for the gate insulating film would be cancelled out. Further, such an extremely thin base oxide film has to cover the surface of the silicon substrate uniformly, and it should not form defects such as interface states.

Although, in general, a thin gate oxide film has been conventionally formed by performing a rapid thermal oxidation (RTO) processing on a silicon substrate, in order to form a thermal oxide film of a desired thickness of 1 nm or less, it is necessary to lower a processing temperature. However, such a thermal oxide film formed at a low temperature is liable to include defects such as interface states or the like, and inadequate for the base oxide film of the high-K dielectric oxide film.

Under these circumstances, in order to form a base oxide film, the inventor of the present invention has proposed to use a UV-excited oxygen radical (UV-$O_2$ radical) substrate processing apparatus capable of forming a high quality oxide film at a low film forming speed, based on a low radical density in International Patent No. WO03/049173A1.

FIG. 1 provides a schematic configuration of a conventional UV-$O_2$ radical substrate processing apparatus 20 in accordance with the above-described proposal.

Referring to FIG. 1, the substrate processing apparatus 20 includes a substrate supporting table 22 which is provided with a heater (not shown) and is vertically movable between a process position and a substrate loading/unloading position; and a processing container 21 which is partitioned to form a process space 21B along with the substrate supporting table 22, wherein the substrate supporting table 22 is rotated by a driving mechanism 22C. Further, the inner wall surface of the processing container 21 is covered with an inner liner (not shown) made of quartz glass, and thus, metallic contamination of target substrate from an exposed metal surface is suppressed.

The processing container 21 is connected to a substrate transferring unit 27 via a gate valve 27A, and thus, while the substrate supporting table 22 is lowered to a loading/unloading position, a target substrate W is transferred from the substrate transferring unit 27 onto the substrate supporting table 22 via the gate valve 27A, and a processed substrate is transferred from the substrate supporting table 22 to the substrate transferring unit 27.

In the substrate processing apparatus 20 shown in FIG. 1, a gas exhaust port 21A is formed near the gate valve 27A of the processing container 21, and a turbo molecular pump (TMP) 23B is connected to the gas exhaust port 21A via a valve 23A and an APC (Automatic Pressure Controller, not shown). The turbo molecular pump 23B is also connected to a dry pump (DP) 24 via a valve 23C, and by driving the turbo molecular pump 23B and the dry pump 24, it is possible to lower the pressure of the process space 21B to $1.33 \times 10^{-1}$~$1.33 \times 10^{-4}$ Pa ($1 \times 10^{-3}$~$1 \times 10^{-6}$ Torr).

Further, the gas exhaust port 21A is connected to the pump 24 directly via a valve 24A and another APC (not shown), and thus, by opening the valve 24A, the pressure in the process space 21B is reduced to the level of 1.33 Pa~1.33 kPa (0.01~10 Torr) by the pump 24.

The processing container 21 is provided with a processing gas supply nozzle 21D supplying an oxygen gas, at a side opposite to the gas exhaust port 21A across the target substrate W, and the oxygen gas supplied to the processing gas supply nozzle 21D flows along the surface of the target substrate in the process space 21B, and is exhausted through the gas exhaust port 21A.

In order to activate the processing gas thus supplied from the processing gas supply nozzle 21D and to generate oxygen radicals, the substrate processing apparatus 20 shown in FIG. 1 is provided with an ultraviolet light source 25 having a quartz window 25A on the processing container 21 at a position corresponding to a region located between the processing gas supply nozzle 21D and the target substrate W, wherein the ultraviolet light source 25 preferably includes an excimer lamp having a wavelength of 172 nm. Thus, by driving the ultraviolet light source 25, the oxygen gas introduced through the processing gas supply nozzle 21D into the process space 21B is activated to generate oxygen radicals, and the oxygen radicals thus formed flow along the surface of the target substrate W. Accordingly, it becomes possible to form a uniform radical oxide film on the surface of the target substrate W with a thickness of 1 nm or less, particularly with the thickness of about 0.4 nm, which corresponds to the thickness of 2~3 atomic layers.

In such a process for generating a radical oxide film shown in FIG. 1, by closing the valve 24A and opening the valve 23A, the pressure of the process space 21B is reduced to the range of $1.33 \times 10^{-1} \sim 1.33 \times 10^{-4}$ Pa ($1 \times 10^{-3} \sim 1 \times 10^{-6}$ Torr), suitable for performing an oxidation process on a substrate by the oxygen radicals.

Further, the processing container 21 is provided with a remote plasma source 26 at the side thereof opposite to the gas exhaust port 21A with respect to the target substrate W. Thus, it is possible to form nitrogen radicals by supplying a nitrogen gas to the remote plasma source 26 together with an inert gas such as Ar or the like and by activating the nitrogen gas thus supplied with a plasma. The nitrogen radicals thus formed are made to flow along the surface of the target substrate W to thereby nitride the substrate surface as shown in FIG. 2. In the plasma nitriding (RFN) process shown in FIG. 2, by closing the valve 23A and opening the valve 24A, the pressure of the process space 21B is reduced to the range of 1.33 Pa~1.33 kPa (0.01~10 Torr). By the plasma nitriding process, it is possible to nitride the extremely thin oxide film of about 0.4 nm in thickness, which has already been formed in the process described with reference to FIG. 1.

However, in such a substrate processing apparatus 20, it has been found that a plasma cannot be easily ignited when the operation is restarted after the processing container 21 has not been operated while the processing container 21 has been left under a vacuum condition for 2~3 days or longer, or has been open to atmosphere for a maintenance and/or the repair.

To ignite a plasma, the inside of the processing container 21 has to be purged repeatedly over 2~3 hours. However, such a purge process over a long period of time deteriorates the substrate processing efficiency significantly.

SUMMARY OF THE INVENTION

It is, therefore, a general object of the present invention to provide a new and useful plasma igniting method and a substrate processing method to solve the aforementioned problems.

It is a more specific object of the present invention to provide a plasma igniting method capable of realizing an efficient plasma ignition and a substrate processing method using such a plasma igniting method.

It is another object of the present invention to provide a plasma igniting method for igniting a plasma inside a plasma source provided for a processing container, including the steps of:

flowing a gas containing oxygen in the processing container;

irradiating, in the processing container, an ultraviolet light to the gas containing oxygen while pumping the inside of the processing container; and driving the plasma source after the step of irradiating the ultraviolet light.

It is still another object of the present invention to provide a substrate processing method having the plasma ignition step igniting a plasma inside the plasma source provided for a processing container, including the steps of:

flowing a gas containing oxygen in the processing container;

irradiating, in the processing container, an ultraviolet light to the gas containing oxygen while pumping the inside of the processing container;

igniting the plasma by driving the plasma source after the step of irradiating the ultraviolet light;

forming radicals, in the processing container, by introducing a processing gas and exciting the processing gas by the plasma; and treating a surface of a substrate by the radicals.

It is a further object of the present invention to provide a substrate processing method, including the steps of:

forming a plasma by supplying a plasma source with a rare gas;

after the step of forming the plasma, supplying a processing gas to the plasma source to form active species of the processing gas by the plasma; and flowing the active species along a surface of a substrate and treating the surface of the substrate with the active species, wherein, before the step of supplying the processing gas carried out after the step of forming the plasma, the method further comprises the step of removing the processing gas from a line supplying the processing gas to the plasma source, and further, the step of supplying the processing gas has a step of gradually increasing a flow rate of the processing gas to a predetermined flow rate, and the step of gradually increasing the flow rate of the processing gas is executed such that the substrate is rotated at least once before the flow rate of the processing gas reaches the predetermined flow rate.

It is a still further object of the present invention to provide a substrate processing method, including the steps of:

forming radicals, in a processing container, by exciting a gas containing oxygen by an ultraviolet light; and treating, in the processing container, a surface of a substrate with the radicals, wherein, after repeating the step of treating the surface of the substrate for a predetermined number of times, the method further includes the steps of:

introducing nitrogen radicals into the processing container; and pumping the inside of the processing container.

In accordance with the present invention, in a plasma igniting method for igniting a plasma inside a plasma source provided for a processing container and a substrate processing method using such a plasma igniting method, by flowing a gas containing oxygen in the processing container, irradiating, in the processing container, an ultraviolet light to the gas containing oxygen while pumping the inside of the processing container, and driving the plasma source, a plasma ignition becomes easy as moisture attached to the inner wall of the processing container is separated.

Further, in accordance with the present invention, in a substrate processing method including the steps of: forming a plasma by supplying the plasma source with a rare gas; after the step of forming the plasma, supplying a processing gas to the plasma source to form active species of the processing gas by the plasma; and flowing the active species along a surface of a substrate and treating the surface of the substrate with the active species, wherein, before the step of supplying the processing gas carried out after the step of forming the plasma, by including the step of removing the processing gas from a line supplying the processing gas to the plasma source, and further, by executing the step of supplying the processing gas so as to gradually increase a flow rate of the processing gas to a predetermined flow rate, and further, at that time, by executing the step of supplying the processing gas such that the substrate is rotated at least once before the flow rate of the processing gas reaches the predetermined flow rate, an overshoot problem of a processing gas flow rate, occurring at the beginning of the gas supply, is solved, and it also becomes possible to form a uniform film on the entire surface of the substrate.

Further, in accordance with the present invention, there is provided a substrate processing method including the steps of: forming radicals, in a processing container, by exciting a gas containing oxygen by an ultraviolet light; and treating, in the processing container, the surface of the substrate with the radicals, wherein after repeating the step of treating the surface of the substrate for a predetermined number of times, the steps of introducing nitrogen radicals into the processing container and pumping the inside of the processing container are executed. Therefore the accumulation of residual $H_2O$ is suppressed, and thus, a film growth of a film formed on the substrate is suppressed.

BRIEF DESCRIPTION OF THE DRAWINGS

FIG. 7 sets forth a graph to explain a second preferred embodiment of the present invention.

DETAILED DESCRIPTION OF THE PREFERRED EMBODIMENTS

First Preferred Embodiment

Figure 1:
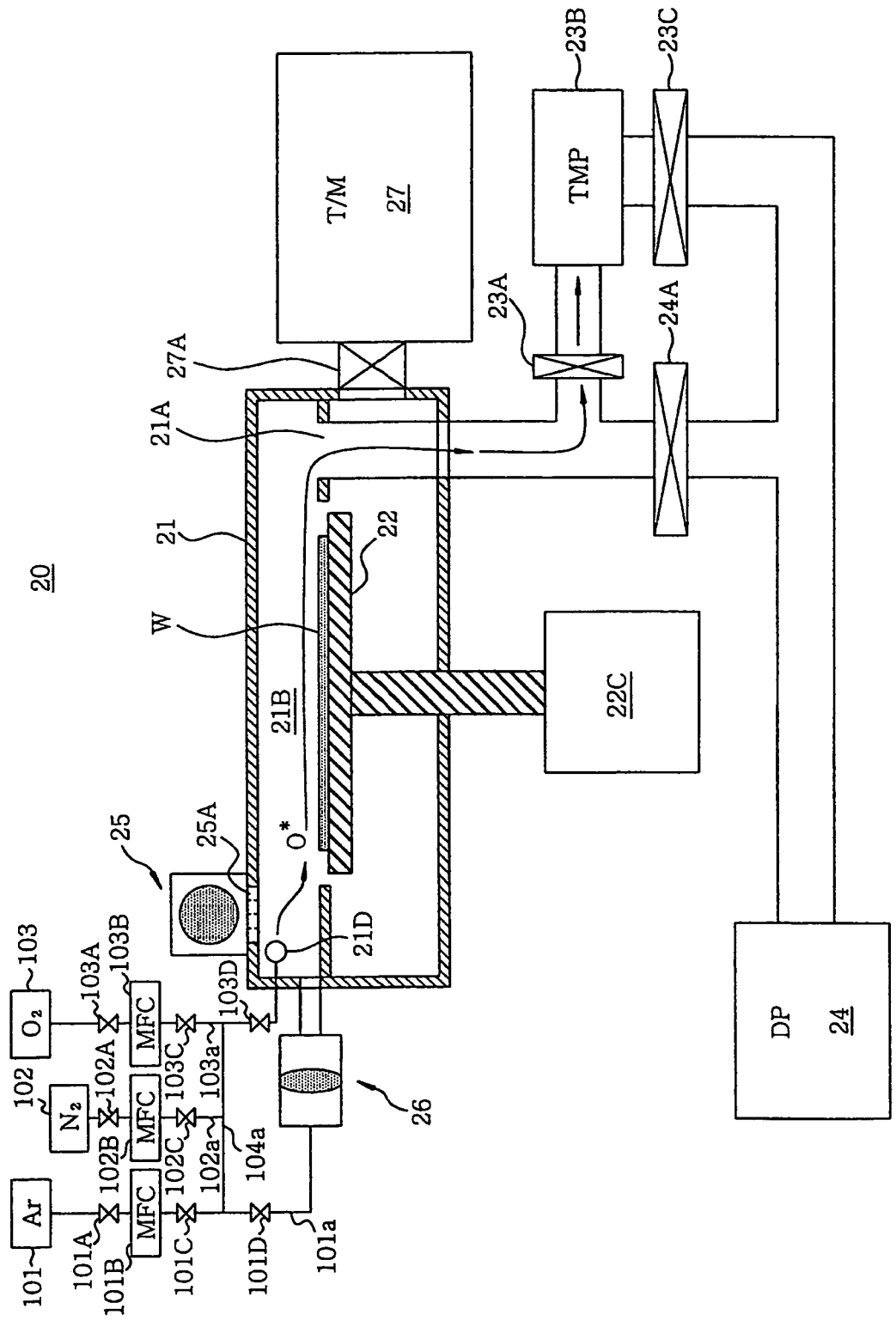
FIG. 1 provides a drawing of a conventional substrate processing apparatus.
Figure 3:
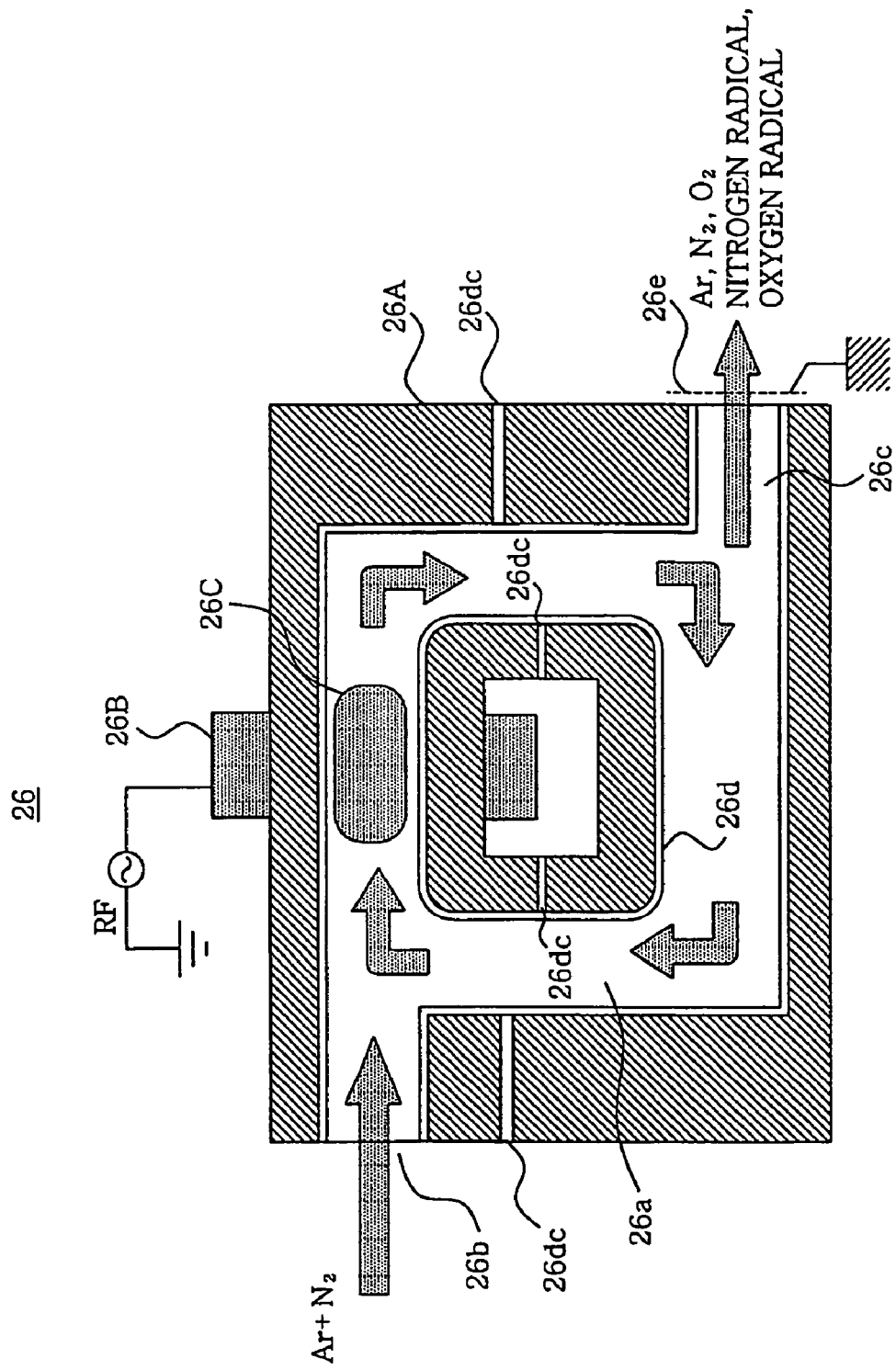
FIG. 3 presents a configuration view of a remote plasma source for use in the substrate processing apparatus shown in FIG. 1.

FIG. 3 presents a configuration view of a high frequency plasma source used in the substrate processing apparatus 20 shown in FIG. 1, as the remote plasma source 26.

Referring to FIG. 3, the remote plasma source 26 includes a block 26A typically formed of aluminum, in which a gas circulation passage 26a is formed together with a gas inlet 26b and a gas outlet 26c communicating therewith, and there is formed a ferrite core 26B on a part of the block 26A. Further, there is formed a DC blocking insulator 26dc on a part of the block 26A.

There is provided an alumite film 26d on inner surfaces of the gas circulating passage 26a, the gas inlet 26b and the gas outlet 26c, and further, the alumite film 26d is impregnated with a fluorocarbon resin. A plasma 26C is formed in the gas circulation passage 26a by perpendicularly supplying a high-frequency (RF) power of 400 kHz frequency to a coil wound around the ferrite core 26B.

By the excitation of the plasma 26C, nitrogen radicals and nitrogen ions are formed in the gas circulation passage 26a. However, the nitrogen ions which move straightforward are annihilated as they are circulated along the circulating passage 26a and the ones ejected through the gas outlet 26c are primarily nitrogen radicals N*. In the configuration shown in FIG. 3, charged particles such as nitrogen ions are eliminated by providing an ion filter 26e at the gas outlet 26c, wherein the ion filter 26e is connected to the ground. Thereby, only the nitrogen radicals are supplied to the process space 21B. Further, in case that the ion filter 26e is not connected to the ground, the ion filter 26e is configured to function as a diffusion plate, charged particles such as nitrogen ions can be sufficiently eliminated. Furthermore, in case executing a process that requires a large amount of N radicals, the ion filter 26e can be removed to prevent N radicals from being eliminated by collisions.

As described above, in such a substrate processing apparatus, it has been found that the plasma cannot be easily ignited when the operation is restarted after the processing container 21 has been open to atmosphere or it has not been operated while the processing container 21 has been left under vacuum state for a few days or longer. Such a problem that the plasma cannot be easily ignited also occurs when the remote plasma source 26 is supplied with only Ar gas which has a low ionization energy. To ignite the plasma under these circumstances, the inside of the processing container 21 has to be purged repeatedly over a few hours. The difficulty in the plasma ignition is considered to be caused by residual moisture or oxygen adsorbed on the inner wall surface of the gas circulation passage 26a.

On this matter, the inventor of the present invention has found that, before igniting the plasma by the plasma source 26, by introducing a gas containing oxygen into the process space 21B inside the processing container 21, and further by irradiating an ultraviolet light having a wavelength of 172 nm from the ultraviolet light source 25 into the processing container, the plasma can be easily ignited immediately. It is conjectured that active species are formed in the process space 21B by the ultraviolet light irradiation which flow into the remote plasma source 26 to thereby facilitate the ignition process.

Thus, the inventor of the present invention conducted a basic research experiment of the present invention by using a substrate processing apparatus 20 which had not been operated for a long period of time, wherein a quadrupole mass spectrometer was to analyze molecular species and ionic species, such as $H^+$, $O^-$, $OH^-$, $H_2O$, $O_2$, $N_2$, generated in the processing container 21 while the ultraviolet light source 25 and the remote plasma source 26 were driven.

Figure 4:
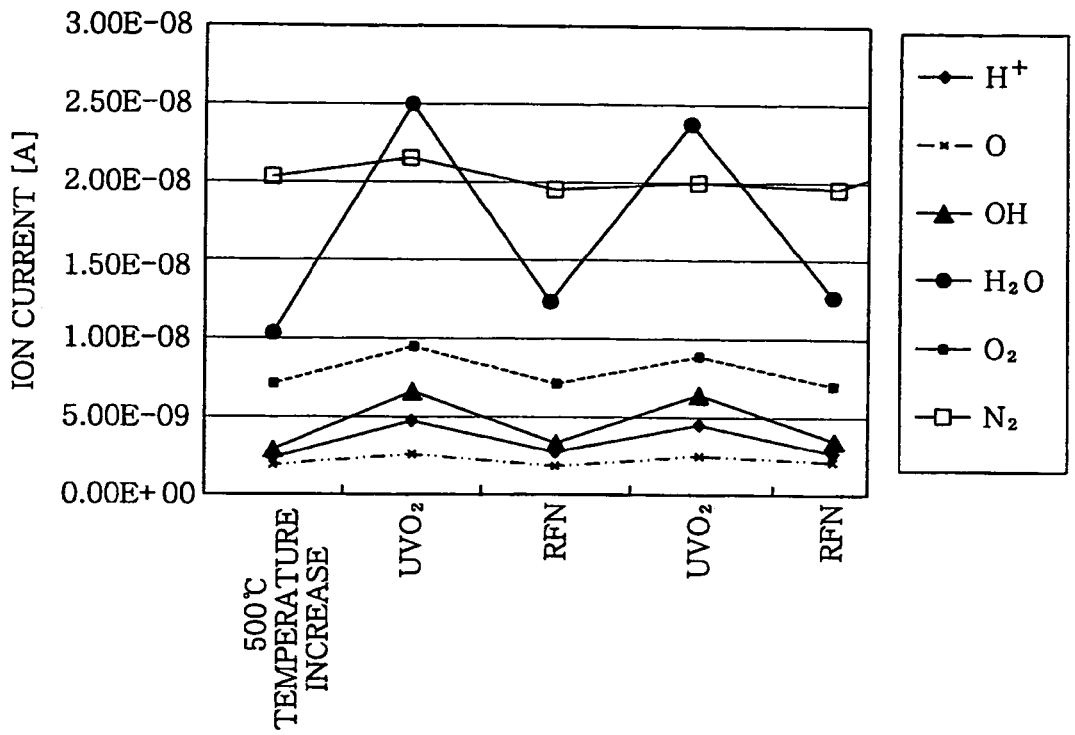
FIG. 4 sets forth a graph to explain a first preferred embodiment of the present invention.

FIG. 4 presents the experimental results. Here, in FIG. 4, ⌈UVO₂⌋ shows the result of analyzing residual chemical species inside the processing container 21, after lowering the internal pressure of the processing container 21 to 6.65 Pa (50 mTorr) through the gas exhaust port 21A, and introducing an oxygen gas through the nozzle 21D at a flow rate of 450 SCCM, and irradiating the ultraviolet light having a wavelength of 172 nm into the space just below the optical window 25A from the ultraviolet light source 25 continuously for twenty minutes, with power of 27 mW/cm², and then, exhausting the inside of the processing container 21 by the turbo molecular pump 23B. Further, in FIG. 4, ⌈RFN⌋ shows the result of analyzing residual chemical species inside the processing container 21, after lowering the internal pressure of the processing container 21 to 6.65 Pa (50 mTorr) through the gas exhaust port 21A, and introducing an Ar gas and a nitrogen gas at a flow rate of 1280 SCCM and 75 SCCM, respectively, through the remote plasma source 26 and further, driving the remote plasma source 26 six times, each being carried out for 60 seconds, therebetween performing vacuum exhaust processes by using the turbo molecular pump 23B, each being carried out for 60 seconds, repeatedly, with the high frequency power of 400 kHz frequency, and then, exhausting the inside of the processing container 21 by using the turbo molecular pump 23B.

Referring to FIG. 4, when the temperature of the substrate supporting table 22 is increased to 500° C. just after the restarting operation of the substrate processing apparatus 20, the amount of $H_2O$ molecules in a floating state in the processing container 21, that is, separated from the wall surface, is $1 \times 10^{-8}$ A in ion current. On the other hand, in case of reducing the internal pressure of the processing container 21 to 6.65 Pa (50 mTorr) and then, driving the ultraviolet light source 25 for twenty minutes, it is shown that the amount of the $H_2O$ molecules in a floating state in the processing container 21 is increased to $2.5 \times 10^{-8}$ A in ion current.

Though the concentration of $H^+$ or $O^-$, $OH^-$, $O_2$, $N_2$ or the like is also increased by driving the ultraviolet light source 25, the rate of increase is small compared to that of $H_2O$, except OH which is involved in the formation of $H_2O$.

Such a result is considered due to the fact that, in case of executing the $UVO_2$ processing, as explained in FIG. 1, active species ($O^*$, $O_2^*$ and the like) generated in the process space 21B are diffused into the plasma source 26, and at that time, $H_2O$ molecules or oxygen molecules adsorbed on the inner wall are activated, and thus, the inner wall surface of the gas circulation passage 26a is activated.

As explained above, before igniting the plasma in the RFN processing, by executing a $UVO_2$ processing, the ignition inside the plasma source 26 is facilitated, thereby making it possible to execute the RFN processing efficiently.

Meanwhile, in case of executing the RFN processing after the $UVO_2$ processing, it is shown that the amount of residual $H_2O$ inside the processing container 21 is reduced to less than $1.50 \times 10^{-8}$ A in ion current, and this result shows that the residual $H_2O$ molecules are discharged from the inside of the processing container 21 as the RFN processing is executed.

Further, in case of executing the $UVO_2$ processing again after the RFN processing, the amount of residual $H_2O$ is increased in the processing container 21. It is considered due to the fact that the separation of $H_2O$ molecules adsorbed on the inner wall of the processing container is facilitated again by repeating the $UVO_2$ processing. The separation of the $H_2O$ molecules is accompanied with the separations of $H^+$, $O^-$, $OH^-$, $O_2$, $N_2$ and the like, but the rates of the separations of these are small compared to that of $H_2O$, except OH.

Figure 5:
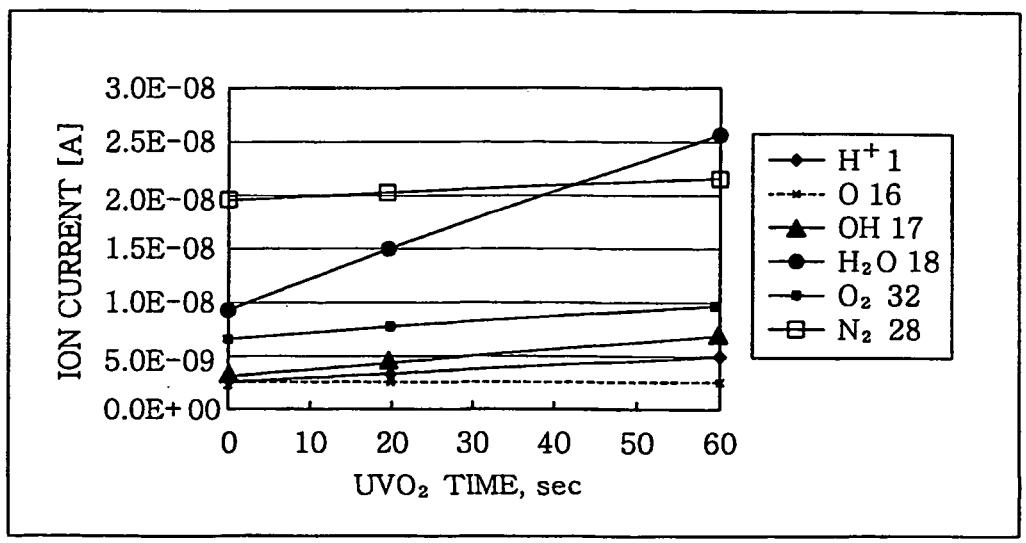
FIG. 5 depicts another graph to explain the first preferred embodiment of the present invention.

FIG. 5 shows a change of the amounts of the floating $H^+$, $O^-$, $OH^-$, $H_2O$, $O_2$, $N_2$ with an elapse of the $UVO_2$ processing time in the processing container 21.

As shown in FIG. 5, it is shown that respective amounts of all the floating chemical species increase as the $UVO_2$ processing time increases, but the increased amount of $H_2O$ is especially prominent. However, by executing $UVO_2$ processing inside the processing container 21, the amount of residual $H_2O$ can be reduced, and thus the plasma can be easily ignited. Accordingly, by executing $UVO_2$ processing once, the difficulty in the plasma ignition is solved.

Figure 6A:
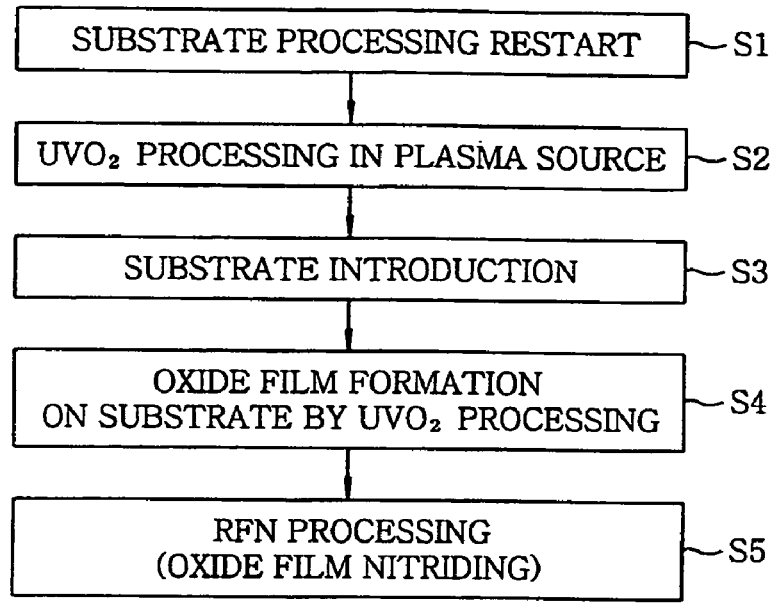
FIG. 6A is a flowchart describing the first preferred embodiment of the present invention.

FIG. 6A is a flowchart describing an example of substrate processing steps in accordance with a first preferred embodiment of the present invention.

Referring to FIG. 6A, in step 1, the operation of substrate processing apparatus 20, wherein the substrate processing apparatus 20 has not been operated for a long period of time or the inside of the processing container or the plasma source 26 of the substrate processing apparatus 20 has been open to atmosphere for a maintenance work, is restarted, and in step 2, the internal pressures of the processing container 21 and the plasma source 26 are reduced to 6.65 Pa, and further the ultraviolet light source 25 is operated for 5 minutes or longer while an oxygen gas is passed through, and thus, the $UVO_2$ processing is executed.

Next, in step 3, the inside of the processing container 21 is exhausted to vacuum, and then, a silicon substrate is introduced as a target substrate W in the processing container 21, and further, in step 4, the $UVO_2$ processing is executed for 1~2 minutes again, and thus, an oxide film, for example, of 0.4 nm in thickness is uniformly formed on the surface of the silicon substrate.

Further, in step 4, the insides of the processing container 21 and the plasma source 26 are purged by an Ar gas or a nitrogen gas, and in step 5, the processing container 21 is supplied with an Ar gas through the plasma source 26, and the pressure is set to be, for example, 133 Pa (1 Torr), and further, the plasma is ignited in the plasma source 26, and further, the plasma source 26 is supplied with a nitrogen gas, and then activated nitrogen is formed. Thus the RFN processing is executed, and the surface of the oxide film is nitrided.

Figure 6B:
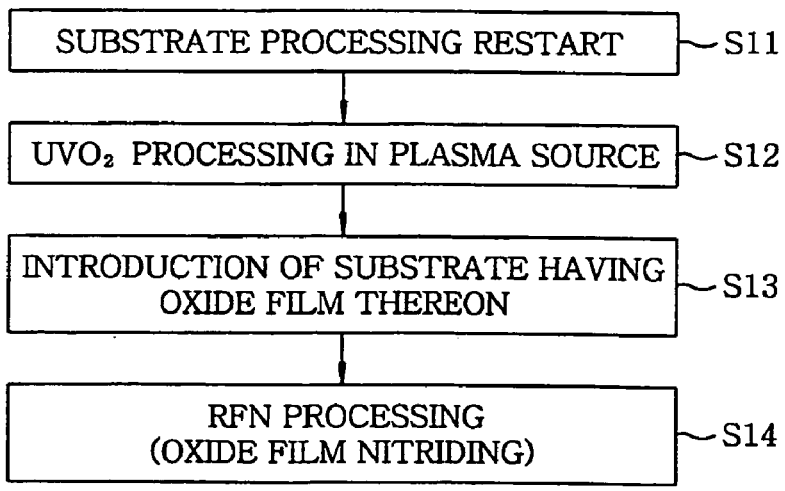
FIG. 6B provides a flowchart describing a modified embodiment of the first preferred embodiment of the present invention.

FIG. 6B is a flowchart describing an example of substrate processing steps in case that a silicon oxide film is already formed on the substrate.

Referring to FIG. 6B, in step 11, the operation of the substrate processing apparatus 20, wherein the substrate processing apparatus 20 has not been operated for a long period of time or the inside of the processing container or the plasma source 26 of the substrate processing apparatus 20 has been open to atmosphere for maintenance work, is restarted, and in step 12, the $UVO_2$ processing corresponding to the step 2 of FIG. 6A is executed.

Next, in step 13, a silicon substrate on which a silicon oxide film is already formed is introduced in the processing container 21 as a target substrate W, and in step 14, corresponding to step 5, the nitriding process of the silicon oxide film is executed.

In accordance with the present invention, before executing the practical substrate processing steps after step 3 or step 13, the $UVO_2$ processing of step 2 or step 12 is executed, and thus, the inner wall of the plasma source 26 is activated. As a result, when the plasma nitriding process of step 5 or step 14 is executed, the plasma source 26 is ignited easily, and thus, the whole efficiency of the substrate processing steps can be improved.

Further, in the present invention, the process pressure of $UVO_2$ processing step of the step 2, 12, or step 4 is not limited to 6.65 Pa (50 mTorr), but the pressure range of $133 \times 10^{-3}$~133 Pa in an oxygen partial pressure can be used.

Figure 9:
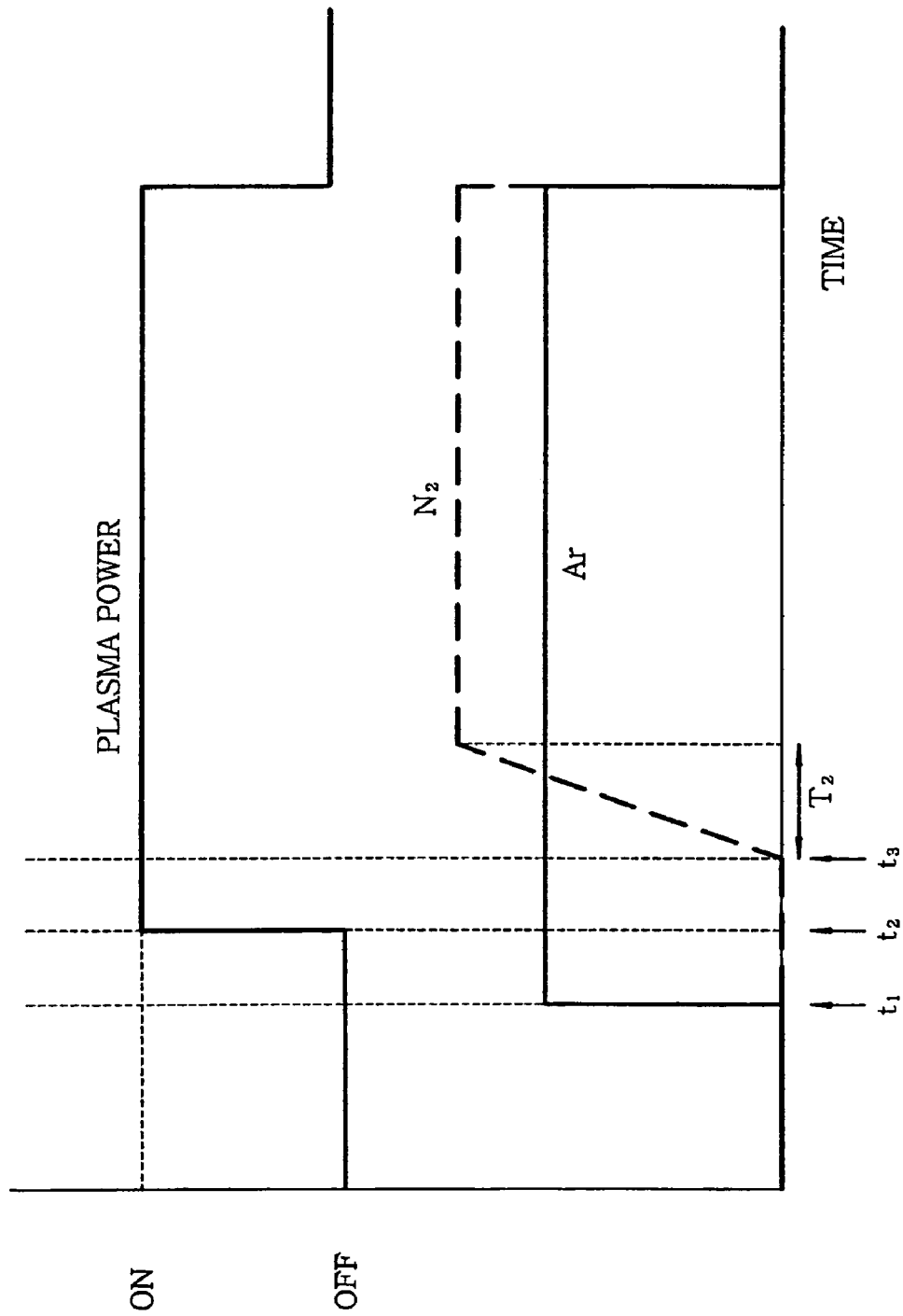
FIG. 9 depicts a graph to describe a plasma ignition sequence in accordance with the second preferred embodiment of the present invention.

Further, in the $UVO_2$ processing step of step 2 or 12, instead of the oxygen gas, one of different gases containing oxygen, for example, a NO gas can be used. Any gases from which active species are generated can be used. For example, in the substrate processing apparatus 20, in case of rotating the target substrate W 35 times per minute by the rotation unit 22C, by controlling a mass flow controller 103B so that $T_2$ shown in FIG. 9 is longer than 1.7 seconds, it becomes possible to form a uniform film on the substrate W.

Second Preferred Embodiment

However, in step 5 or step 14 of the above preferred embodiment, in case of igniting a plasma by driving the remote plasma source 26, the ignition condition is substantially limited, and the plasma is not ignited easily if an Ar gas and a processing gas, that is, a nitrogen gas are supplied at the same time.

FIG. 7 presents a gas supply sequence of such a remote plasma source 26.

Referring to FIG. 7, an Ar gas is supplied to the remote plasma source 26 at time $t_1$, and a high frequency power is supplied at time $t_2$, and thus, the plasma is ignited. Further, in the sequence of FIG. 7, the supply of a nitrogen gas is started at time $t_3$. At that time, the flow rate of the nitrogen gas supplied by a mass flow rate controller is increased slowly so that the plasma is sustained with stability.

Figure 2:
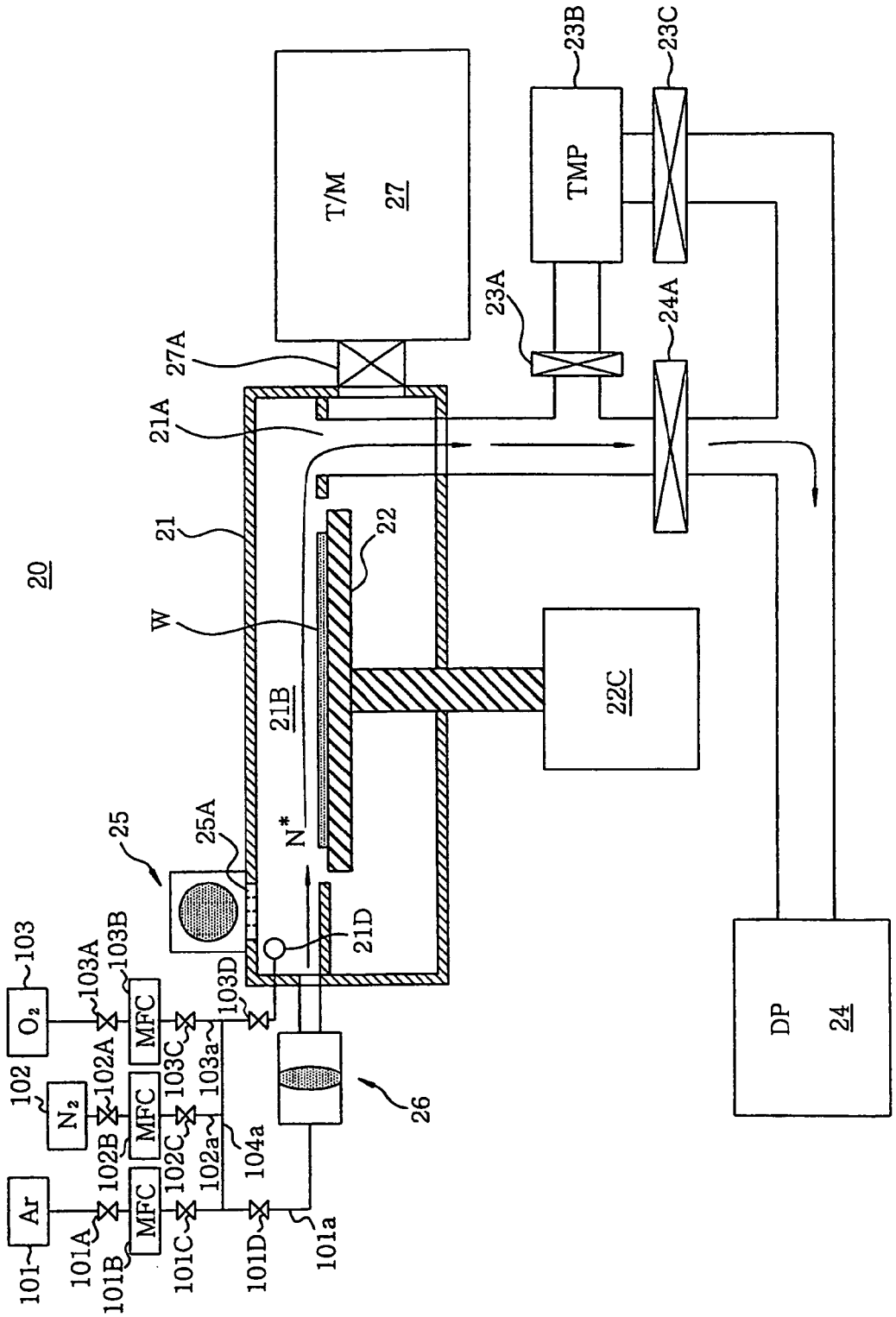
FIG. 2 illustrates another state of the substrate processing apparatus shown in FIG. 1.
Figure 8:
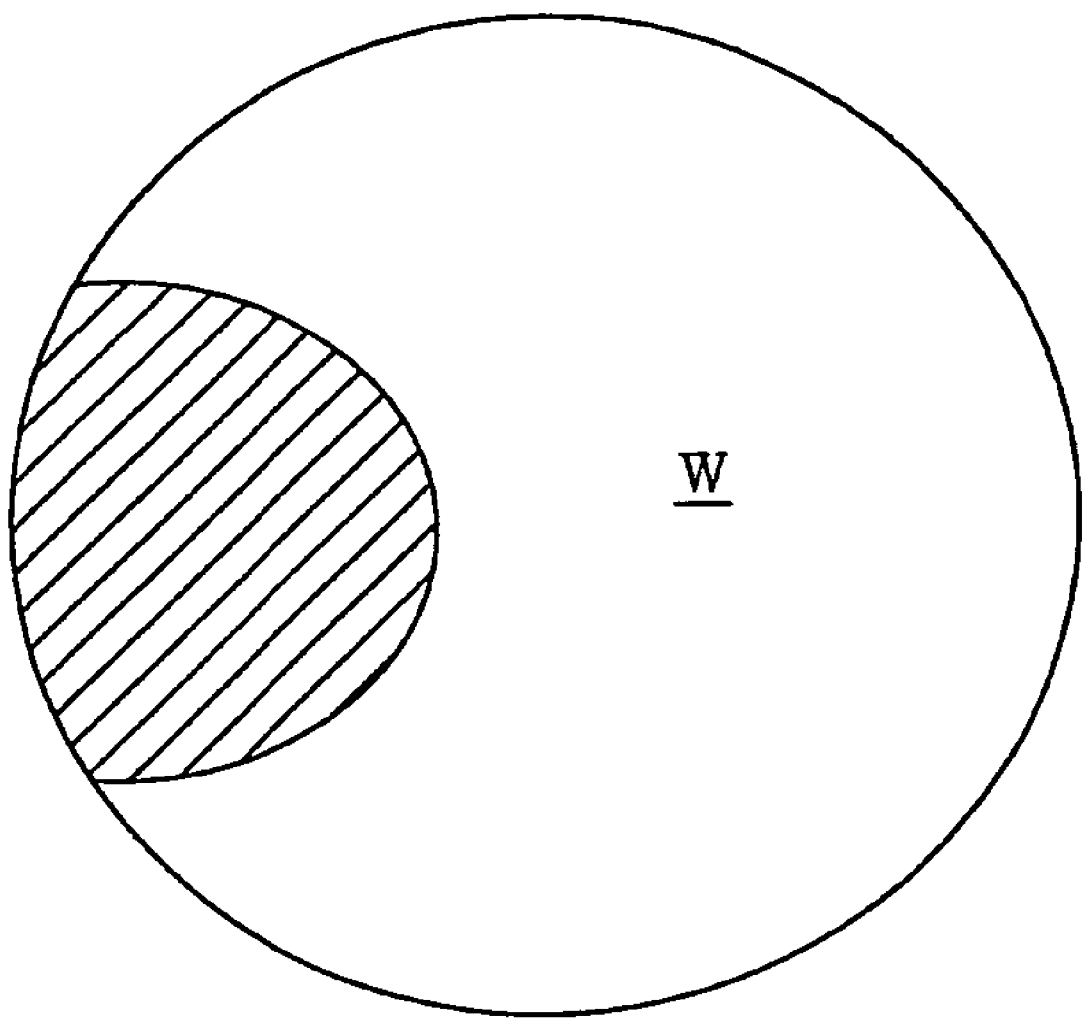
FIG. 8 illustrates a drawing to explain the second preferred embodiment of the present invention.

However, practically, in case of starting the supply of a nitrogen gas at time $t_3$, a large amount of nitrogen gas is supplied in a moment, thus an overshoot of a nitrogen flow rate may be made. The duration $T_1$ of the overshoot is substantially short, thus the stability of the plasma is not influenced seriously. However, as shown in FIG. 2, in the substrate processing apparatus 20 having a configuration supplying nitrogen radicals N* from the side direction of the rotating target substrate, a leveling of the substrate processing by the effect of the rotation becomes not effective, and thus, as shown in FIG. 8, the thickness of nitride film formed is partially increased at the region near the remote plasma source 26 when the overshoot is made, and thus, the obtained film becomes not uniform. In this case, particularly in case of oxidizing a substantially thin silicon oxide film of 0.4 nm in thickness, it becomes a serious problem.

Such an overshoot occurring when the supply of a nitrogen gas starts is considered due to the residual nitrogen gas left in the line supplying a nitrogen gas to the remote plasma source 26 which is discharged simultaneously with the start of supply at a time.

We refer to FIG. 1 again.

FIG. 1 provides a configuration of a gas supply system for supplying a nitrogen gas to the remote plasma source 26.

Referring to FIG. 1, an Ar gas is supplied through a valve 101A, a mass flow controller 101B, a valve 101C and a line 101a to the remote plasma source 26, and further, a nitrogen gas is supplied through a valve 102A, a mass flow controller 102B, a valve 102C, a line 102a, a line 104a, and a line 101a from the nitrogen gas source 102. And further, an oxygen gas is supplied from an oxygen gas source 103 to the gas nozzle 21D through a valve 103A, a mass flow controller 103B, a valve 103C and a line 103a. The line 101a, 102a and 103a are connected to a line 104a, and thus, by operating the valves 101A, 101B, 101C, 102A, 102B, 102C, 103A 103B and 103C, it becomes possible to supply any gas of an Ar gas in the Ar gas source 101, a nitrogen gas in a nitrogen gas source 102 and an oxygen gas in the oxygen gas source 103 to the remote plasma source 26 or the gas nozzle 21D together with other gas/gases, when necessary.

When neither the RFN processing nor the UVO$_2$ processing is executed, that is, neither the remote plasma source 26 nor the ultraviolet light source 25 is driven, all the valves 101A~101D, 102A~102C and 103A~103D are closed. However, in this state, inside the upstream side of the valve 101D of the line 101a, that is, inside the line divided by the valve 102A and the valve 101D is filled with a nitrogen gas. The overshoot is considered to occur because as the RFN processing is started, the valve 101D is opened, and thus, the filled nitrogen gas is caused to flow into the remote plasma source 26. Accordingly, the plasma is ignited in the remote plasma source 26 in such a sequence that, at first only Ar gas having low ionization energy is supplied and thus, the plasma is ignited and then, a nitrogen gas is added slowly so that the plasma is not extinguished.

Further, in accordance with the present embodiment, before igniting the plasma by driving the remote plasma source 26 with the high frequency, the valve 101D is opened, and thus the trapped nitrogen gas is exhausted through the processing container 21 by the turbo molecular pump 23B.

After that, by opening the valve 102A, and driving the mass flow controller 102B, as shown in FIG. 9, a nitrogen gas can be supplied to the remote plasma source 26 without generating an overshoot.

At that time, by setting an increasing rate of a nitrogen gas flow rate with the mass flow controller 102B such that the target substrate W is rotated at least once in the interval of $T_2$ during which the nitrogen gas flow rate reaches the predetermined flow rate, the above-described problem in FIG. 8 wherein a non-uniform film is formed at the peripheral region can be avoided.

Third Preferred Embodiment

As explained above, when the UVO$_2$ processing is executed, in the substrate processing apparatus 20 shown in FIG. 1, the moisture is separated from the inner wall of the processing container 21, and thus, the concentration of residual H$_2$O is increased in the process space 21B. Similarly, the moisture is also separated in case of executing a UVNO processing including the steps of: introducing a NO gas through the nozzle 21D; by exciting it with the ultraviolet light source 25, forming nitrogen radicals N* and oxygen radicals O*; and forming SiON film on the silicon substrate surface by using thus formed nitrogen radicals N* and oxygen radicals O* in the substrate processing apparatus 20 shown in FIG. 1.

In case of the above UVO$_2$ processing, when nitriding the silicon oxide film formed by the UVO$_2$ processing by generating an Ar/N$_2$ plasma by the remote plasma source 26 by the RFN processing, the concentration of the residual H$_2$O in the process space 21B is rapidly decreased as shown in FIG. 4. Therefore, the concentration of the residual H$_2$O in the process space 21B is almost constant, as long as the UVO$_2$ processing and the RFN processing are executed alternately, regardless of how many times the substrate processing is executed.

On the other hand, in case of forming a SiON film on the silicon substrate surface by the UVNO processing, RFN processing is not required, and thus, the concentration of the residual H$_2$O in the process space 21B increases as the number of performances of the substrate processing increases. Meanwhile, as the concentration of the residual H$_2$O in the process space 21B increases as described above, it is apprehended that the thickness of the formed SiON film may increase accordingly.

Figure 10:
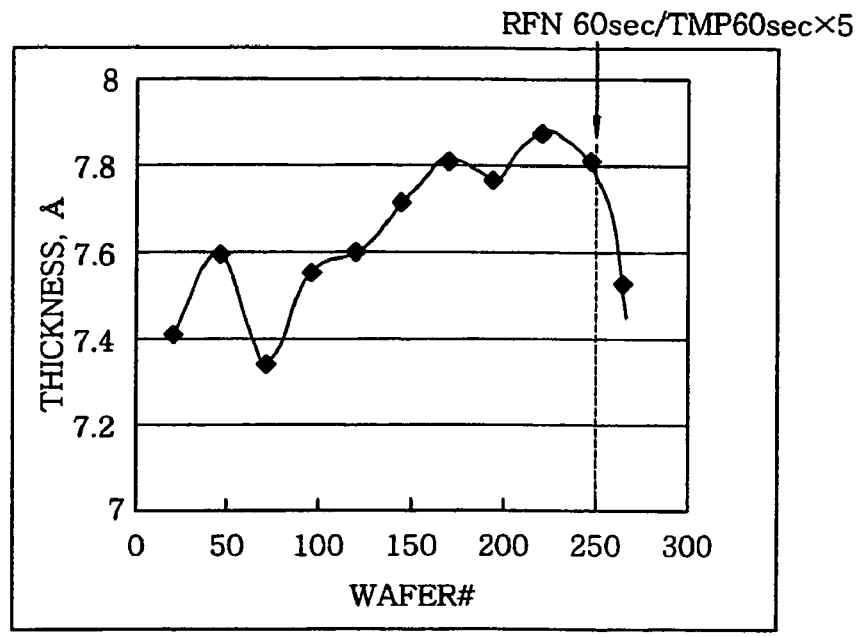
FIG. 10 sets forth a graph to explain a third preferred embodiment of the present invention.

FIG. 10 sets forth a graph to explain a relationship, in the substrate processing apparatus 20 shown in FIG. 1, between the film thickness of the formed SiON film and the number of performances of the substrate processing in case of executing a UVNO processing. The film thickness in FIG. 10 is measured by a spectral ellipsometry. Further, the UVNO processing of FIG. 10 is executed in the pressure of 13.3 Pa and the substrate temperature of 700° C.

Referring to FIG. 10, the film thickness of SiON film formed on the silicon substrate by the UVNO processing tends to increase with the number of performances of the substrate processing (wafer#), and particularly if the number of performances of the substrate processing exceeds 150, it is shown clearly that the film thickness increases.

On the other hand, in FIG. 10, if the RFN processing is performed for 60 seconds after 250 substrates are processed, and further the processing container 21 is exhausted five times each being carried out for 60 seconds by the pump (TMP) 23B, it is shown that the film thickness of the formed SiON film decreases rapidly.

According to the relationship shown in FIG. 10, after every 150 substrate processings, by executing the RFN processing and the exhaust processing regularly, it is shown that the increase in the film thickness of the SiON film formed on the silicon substrate is suppressed.

Figure 11:
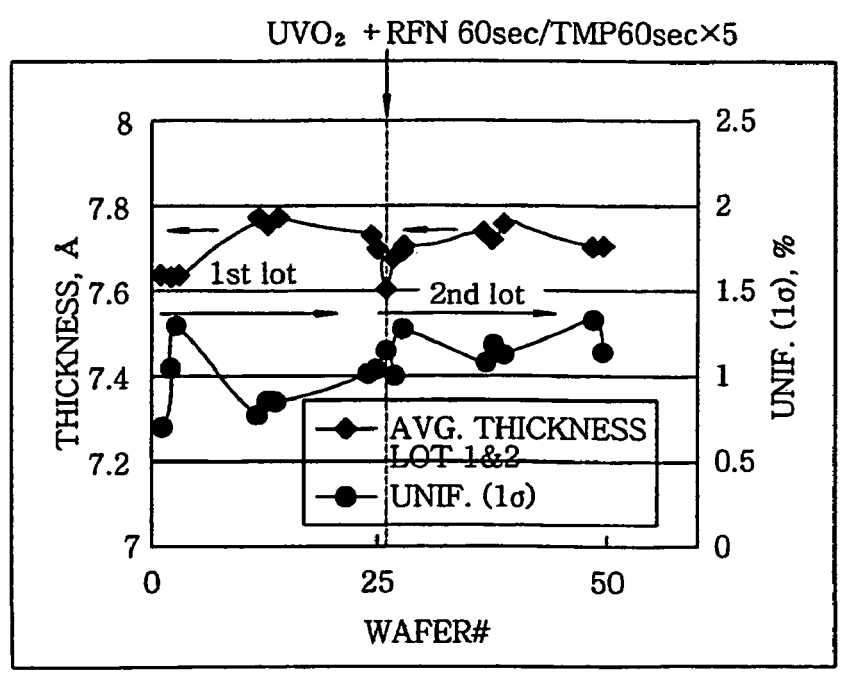
FIG. 11 depicts another graph to explain the third preferred embodiment of the present invention.

Further, FIG. 11 depicts the film thickness and the uniformity in case of executing the RFN processing accompanied with the exhaust processing after every 25 target substrates processings, as explained in the above embodiment. The RFN processing and the exhaust processing are executed while the target substrate W is extracted from the processing container 21.

According to the relationship shown in FIG. 11, it is shown that the increase in the film thickness of the SiON film is not materialized if the RFN processing is executed after every 25 or less substrates processings. The deterioration of the SiON film uniformity can also be suppressed by executing such a RFN processing regularly.

Figure 12:
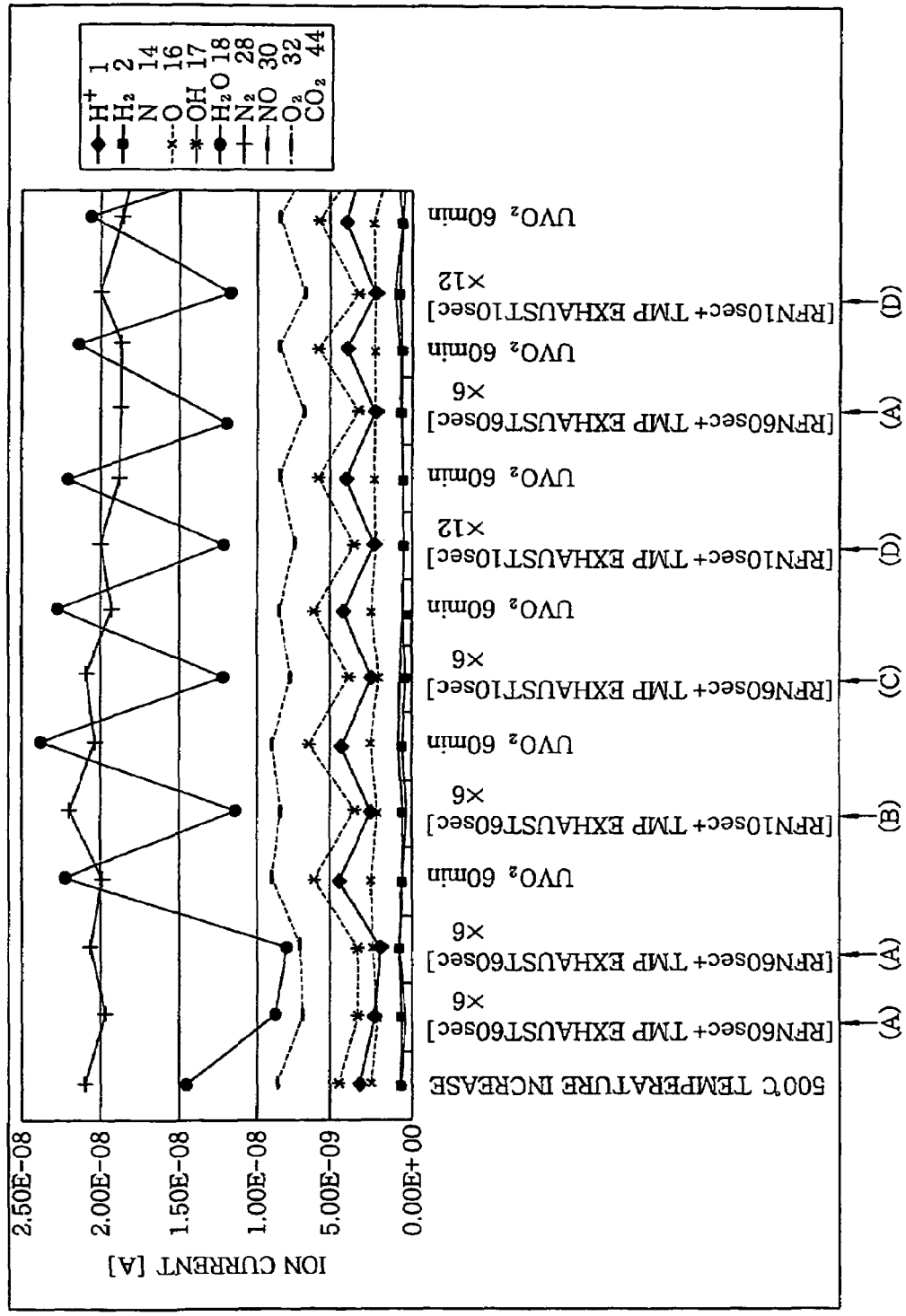
FIG. 12 depicts still another graph to explain the third preferred embodiment of the present invention.

FIG. 12 shows the result of analyzing residual chemical species such as $H^+$, $H_2$, $O^-$, $OH^-$, $H_2O$, $N_2$, NO and $O_2$, inside the processing container 21 by using a quadrupole mass spectrometer. In the experiment shown in FIG. 12, the $UVO_2$ processing corresponding to the UVNO processing of 25 silicon substrates is executed for 60 minutes.

Referring to FIG. 12, the concentration of the residual $H_2O$ was measured in case of executing (A) the RFN processing for 60 seconds and the exhaust processing six times each being carried out for 60 seconds, (B) the RFN processing for 10 seconds and the exhaust processing six times each being carried out for 60 seconds, (C) the RFN processing for 60 seconds and the exhaust processing six times each being carried out for 10 seconds, (D) the RFN processing for 10 seconds and the exhaust processing twelve times each being carried out for 10 seconds. It was shown that the concentration of the residual $H_2O$ became the lowest, in case of executing (A) the RFN processing for 60 seconds and the exhaust processing six times each being carried out for 60 seconds, by the experiment.

Thus, in accordance with the present embodiment, though the RFN processing is not needed in the substrate processing steps, by executing the RFN processing and the exhaust processing after the $UVO_2$ processing or the UVNO processing is repeated for a predetermined number of times, the $H_2O$ separated from the sidewall surface of the processing container 21 can be prevented from being accumulated inside the process space 21B, and thus, a film growth of a film formed is suppressed. Further, in case that the processing container 21 has been open to atmosphere or in idle status, by executing the $UVO_2$ processing in the plasma source, the plasma is ignited easily as the RFN processing is executed, and at the same time, the moisture in the processing container can be removed.

Fourth Preferred Embodiment

Figure 13:
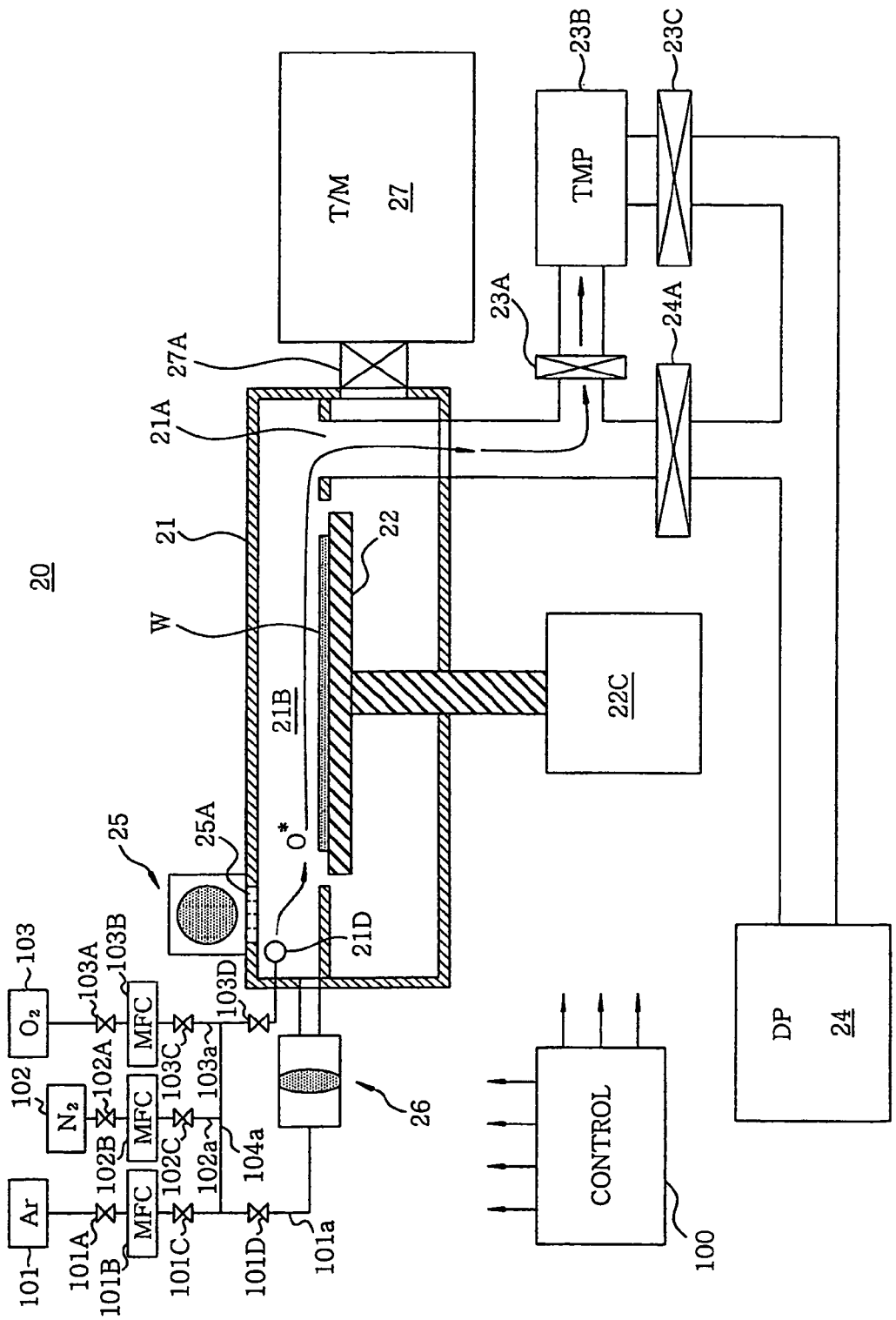
FIG. 13 provides a drawing to explain a fourth preferred embodiment of the present invention.

FIG. 13 provides a drawing to explain a configuration of the substrate processing apparatus 20 used in the above preferred embodiments, including a control system. In FIG. 13, the components explained above are indicated by the same reference characters, and the explanations of them are omitted.

Referring to FIG. 13, a control unit 100 composed of a computer loaded with a control program is cooperating with the substrate processing apparatus 20, wherein the control unit 100 controls: a pumping system including a turbo molecular pump 23B, a dry pump 24 and valves 23A, 23C and 24A; a processing container peripheral unit including a substrate transferring unit 27, a substrate supporting table 22 and a driving mechanism 22C; a radical formation unit including an ultraviolet light source 25 and a remote plasma source 26; and a gas supply system including gas sources 101~103 and valves·mass flow controllers 101A~101D, 102A~102C and 103A~103D, in accordance with the control program. Such a control includes the control shown in the flowchart of FIGS. 6A and 6B, the control shown in FIGS. 7 and 9, and the control shown in FIGS. 11 and 12.

Figure 14:
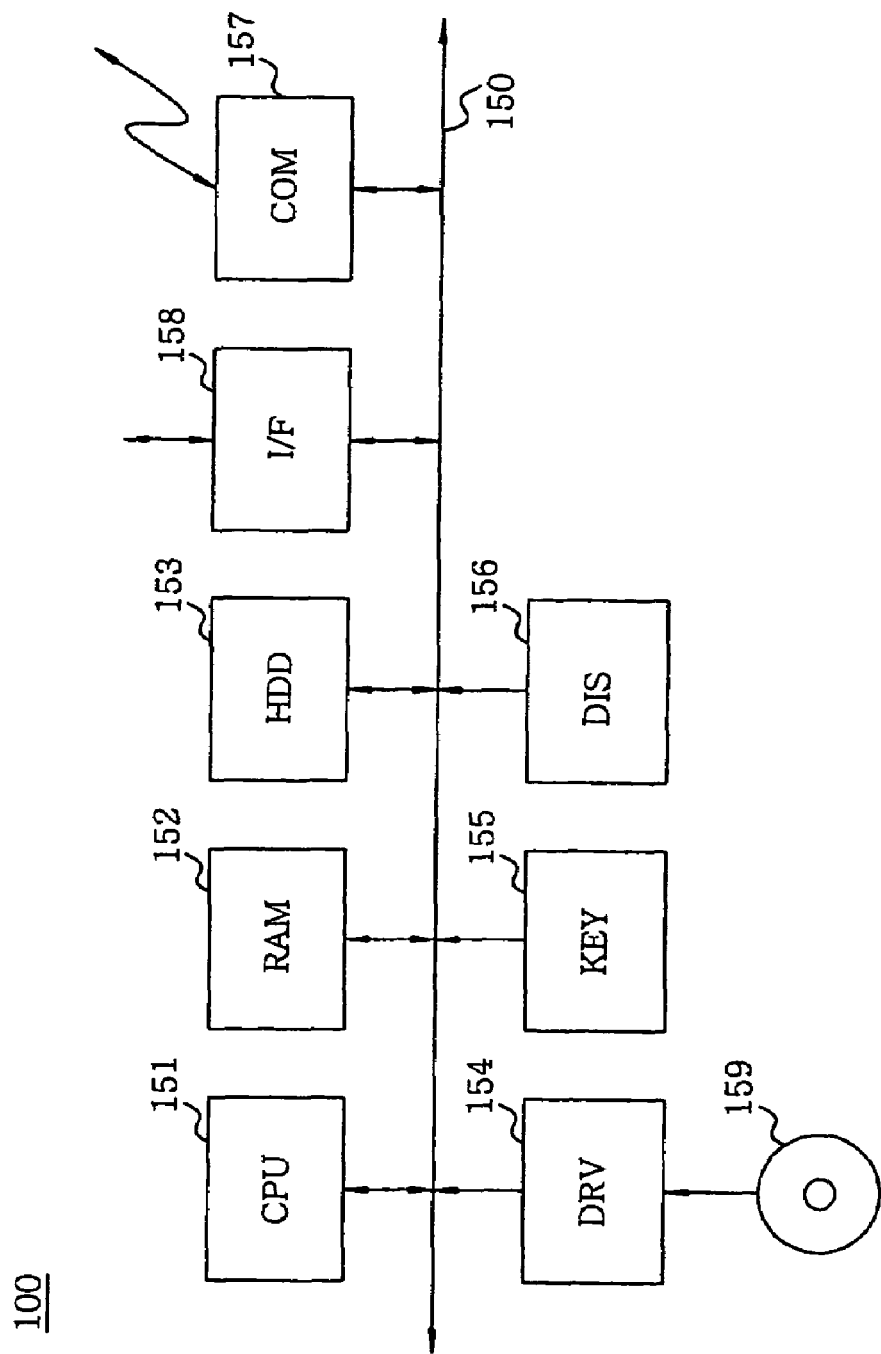
FIG. 14 presents a configuration of a computer used in FIG. 13.

The computer which composes the control unit 100 shown in FIG. 13, has a configuration shown in FIG. 14, and it may be a general purpose computer.

Referring to FIG. 14, the computer 100 includes a processor (CPU) 151, a memory (RAM) 152, a program storage device (HDD) 153, a disk drive 154 such as a floppy disk, an optical disk drive or the like, an input device 155 such as a keyboard, a mouse or the like, a display unit 156, a network interface 157, and an interface 158, and the computer 100 controls the substrate processing apparatus 20 through the interface 158.

The disk drive includes a computer readable storage medium 159 such as a floppy disk, an optical disk drive or the like, and thus, it reads control program codes of the substrate processing apparatus 20, which are recorded on the storage medium, and stores them in the HDD 153. Otherwise, the control program code can be supplied from the network through the network interface 157.

Thus supplied program code is loaded into the RAM 152, and the CPU 151 controls the substrate processing apparatus 20 through the interface 158, in accordance with the program code in the RAM 152. Accordingly, the substrate processing apparatus 20 conducts the operations explained in the above embodiments. Further, it is also possible to load directly the control program code into the RAM 152 from the disk drive 154 or the network interface 157, without storing the control program code in the HDD 153.

Further, the present invention is not limited to the substrate processing apparatus explained in FIGS. 1 and 2, and it can be applied to any apparatuses having a plasma source and an ultraviolet light source. Further, the plasma source of the present invention is not limited to the remote plasma source explained in FIG. 3.

In accordance with the present invention, in a plasma igniting method for igniting a plasma inside a plasma source provided for a processing container and a substrate processing method using such a plasma igniting method, by flowing a gas containing oxygen in the processing container, irradiating, in the processing container, an ultraviolet light to the gas containing oxygen while pumping the inside of the processing container, and driving the plasma source, a plasma ignition becomes easy as moisture attached to the inner wall of the processing container is separated.

Further, in accordance with the present invention, in a substrate processing method including the steps of: forming a plasma by supplying the plasma source with a rare gas; after the step of forming the plasma, supplying a processing gas to the plasma source to form active species of the processing gas by the plasma; and flowing the active species along a surface of a target substrate and treating the surface of the target substrate with the active species, wherein, before the step of supplying the processing gas carried out after the step of forming the plasma, by including the step of removing the processing gas from a line supplying the processing gas to the plasma source, and further, by executing the step of supplying the processing gas so as to gradually increase a flow rate of the processing gas to a predetermined flow rate, and further, at that time, by executing the step of supplying the processing gas such that the target substrate is rotated at least once before the flow rate of the processing gas reaches the predetermined flow rate, an overshoot problem of a processing gas flow rate, occurring at the beginning of the gas supply, is solved, and it also becomes possible to form a uniform film on the entire surface of the substrate.

Further, in accordance with the present invention, there is provided a substrate processing method including the steps of: forming radicals, in a processing container, by exciting a gas containing oxygen by an ultraviolet light; and treating, in the processing container, the surface of the target substrate with the radicals, wherein after repeating the step of treating the surface of the target substrate for a predetermined number of times, the steps of introducing nitrogen radicals into the processing container and pumping the inside of the processing container are executed. Therefore the accumulation of residual $H_2O$ is suppressed, and thus, a film growth of a film formed on the target substrate is suppressed.

While the invention has been shown and described with respect to the preferred embodiments, it will be understood by those skilled in the art that various changes and modifications may be made without departing from the scope of the invention as defined in the following claims.

What is claimed is:

1. A method for processing a to-be-processed substrate accommodated in a processing container comprising the steps of:
    flowing a gas containing oxygen in the processing container;
    irradiating, in the processing container, an ultraviolet light to the gas containing oxygen to form oxygen radicals, thereby separating $H_2O$ molecules adsorbed on an inner wall of the processing container therefrom while pumping the gas containing oxygen from an inside of the processing container;
    performing an oxidation on a surface of the substrate by the oxygen radicals;
    supplying a nitrogen gas into a plasma source connected to the processing container to form nitrogen radicals; and
    flowing the nitrogen radicals from the plasma source to the processing container, thereby discharging residual $H_2O$ molecules from the processing container.

2. The method of claim 1, wherein the gas containing oxygen is an oxygen gas or an NO gas.

3. The method of claim 1, wherein, in the step of flowing the nitrogen radicals, the nitrogen radicals are flowed along the surface of the substrate to nitride the surface of the substrate.

4. The method of claim 1, wherein the nitrogen radicals are flowed to the processing container after the substrate is extracted from the processing container.

5. The method of claim 1, wherein an Ar gas is supplied into the plasma source to ignite a plasma in the plasma source.

6. The method of claim 1, wherein the nitrogen gas is supplied by gradually increasing a flow rate of the nitrogen gas to a predetermined flow rate.

* * * * *